United States Patent
Lowry

(10) Patent No.: US 8,094,454 B2
(45) Date of Patent: Jan. 10, 2012

(54) IMMERSION COOLING APPARATUS FOR A POWER SEMICONDUCTOR DEVICE

(75) Inventor: Michael J. Lowry, Indianapolis, IN (US)

(73) Assignee: Delphi Technologies, Inc., Troy, MI (US)

( * ) Notice: Subject to any disclaimer, the term of this patent is extended or adjusted under 35 U.S.C. 154(b) by 250 days.

(21) Appl. No.: 12/624,093

(22) Filed: Nov. 23, 2009

(65) Prior Publication Data

US 2011/0122583 A1 May 26, 2011

(51) Int. Cl.
*H05K 7/20* (2006.01)
*H01L 23/473* (2006.01)

(52) U.S. Cl. ........ 361/699; 361/698; 361/718; 361/719; 257/704; 257/710; 257/714; 257/717; 165/80.4

(58) Field of Classification Search ............... 361/698, 361/699, 718, 719; 257/704, 710, 714, 717; 165/80.4; 372/34–36
See application file for complete search history.

(56) References Cited

U.S. PATENT DOCUMENTS

| | | | | |
|---|---|---|---|---|
| 3,616,533 A | * | 11/1971 | Heap et al. ................. 29/837 |
| 4,704,658 A | * | 11/1987 | Yokouchi et al. ........... 361/698 |
| 4,765,397 A | * | 8/1988 | Chrysler et al. ......... 165/104.33 |
| 4,995,892 A | * | 2/1991 | Garrett et al. ................. 65/379 |
| 5,006,924 A | * | 4/1991 | Frankeny et al. ............. 257/714 |
| 5,014,161 A | * | 5/1991 | Lee et al. ..................... 361/709 |
| 5,168,919 A | * | 12/1992 | Berenholz et al. .......... 165/80.4 |
| 5,305,184 A | * | 4/1994 | Andresen et al. ............ 361/699 |
| 5,448,108 A | * | 9/1995 | Quon et al. .................. 257/714 |
| 5,485,671 A | * | 1/1996 | Larson et al. ............ 29/890.032 |
| 5,495,490 A | * | 2/1996 | Rice et al. ...................... 372/34 |
| 5,720,338 A | * | 2/1998 | Larson et al. ................... 165/46 |
| 5,774,334 A | * | 6/1998 | Kawamura et al. ........... 361/699 |
| 5,978,220 A | * | 11/1999 | Frey et al. ..................... 361/699 |
| 6,052,284 A | * | 4/2000 | Suga et al. .................... 361/699 |
| 6,351,384 B1 | * | 2/2002 | Daikoku et al. ............... 361/704 |
| 6,724,792 B2 | * | 4/2004 | Rice .............................. 372/36 |
| 6,744,136 B2 | * | 6/2004 | Dubhashi ...................... 257/714 |
| 7,016,383 B2 | | 3/2006 | Rice |
| 7,030,317 B1 | * | 4/2006 | Oman ........................... 174/541 |
| 7,077,189 B1 | * | 7/2006 | Reyzin et al. ................ 165/80.4 |
| 7,133,286 B2 | * | 11/2006 | Schmidt et al. ............... 361/718 |
| 7,205,653 B2 | * | 4/2007 | Brandenburg et al. ....... 257/714 |
| 7,365,981 B2 | * | 4/2008 | Myers et al. .................. 361/699 |
| 7,411,290 B2 | * | 8/2008 | Lee et al. ...................... 257/712 |
| 7,551,439 B2 | * | 6/2009 | Peugh et al. .................. 361/699 |

(Continued)

FOREIGN PATENT DOCUMENTS

JP 03229493 A * 10/1991

*Primary Examiner* — Anatoly Vortman
(74) *Attorney, Agent, or Firm* — Thomas N. Twomey

(57) ABSTRACT

An immersion cooling apparatus includes a multi-terminal thermally conductive module that supports and encloses a power semiconductor device and a housing defining a flow-through chamber in which the thermally conductive module is mounted and through which liquid coolant is circulated. The thermally conductive module has first and second oppositely disposed connector headers housing terminal pins or blades electrically coupled to the semiconductor device, and the connector headers protrude through openings in oppositely disposed sidewalls of the housing so that the portion of the thermally conductive module between the connector headers is suspended in the chamber and immersed in the circulating coolant. The thermally conductive module is sealed against the housing sidewalls around the openings, and one of the sidewalls is removable to facilitate installation of the thermally conductive module in the housing or its subsequent removal.

5 Claims, 5 Drawing Sheets

U.S. PATENT DOCUMENTS

| | | | |
|---|---|---|---|
| 7,608,924 B2 * | 10/2009 | Myers et al. | 257/714 |
| 7,660,335 B2 * | 2/2010 | Thiagarajan et al. | 372/34 |
| 7,768,777 B2 * | 8/2010 | Miller | 361/679.53 |
| 8,014,150 B2 * | 9/2011 | Campbell et al. | 361/700 |
| 2001/0033477 A1 * | 10/2001 | Inoue et al. | 361/718 |
| 2002/0162673 A1 * | 11/2002 | Cook et al. | 174/35 MS |
| 2003/0053294 A1 * | 3/2003 | Yamada et al. | 361/699 |
| 2003/0080413 A1 * | 5/2003 | Dubhashi | 257/714 |
| 2008/0272485 A1 * | 11/2008 | Myers et al. | 257/714 |
| 2010/0208427 A1 * | 8/2010 | Horiuchi et al. | 361/699 |

* cited by examiner

IMMERSION COOLING APPARATUS FOR A POWER SEMICONDUCTOR DEVICE

TECHNICAL FIELD

The present invention relates to apparatus for cooling a power semiconductor device, and more particularly to an electronic module incorporating the power semiconductor device and a flow-through coolant chamber in which the electronic module is installed.

BACKGROUND OF THE INVENTION

Various arrangements have been devised for dissipating heat generated by power semiconductor devices such as IGBTs and MOSFETs. For example, a power device in the form of a semiconductor die can be mounted on an insulative but thermally conductive substrate (ceramic, for example) that, in turn, is thermally coupled (by solder or thermal grease) to an air-cooled or liquid-cooled heatsink. And in fact, a similar technique can be applied to both sides of a semiconductor die, as shown for example, in the U.S. Pat. No. 7,030,317 to Oman. It is also known that a power semiconductor device and substrate can be mounted in a chamber through which a liquid coolant flows; see, for example, the U.S. Pat. No. 7,016,383 to Rice.

SUMMARY OF THE INVENTION

The present invention provides an improved immersion cooling apparatus for at least one power semiconductor device, including a multi-terminal thermally conductive module that supports and encloses the semiconductor device, and a housing defining a flow-through chamber in which the thermally conductive module is mounted and through which liquid coolant is circulated. The thermally conductive module has first and second oppositely disposed connector headers housing terminal pins or blades electrically coupled to the semiconductor device, and the connector headers protrude through openings in oppositely disposed sidewalls of the housing so that a body portion of the thermally conductive module between the connector headers is suspended in the chamber and immersed in the flowing coolant. The thermally conductive module is sealed against the housing sidewalls around the openings, and one of the sidewalls is removable to facilitate installation of the thermally conductive module in the housing, as well as its subsequent removal.

DESCRIPTION OF THE PREFERRED EMBODIMENT

Figure 1:
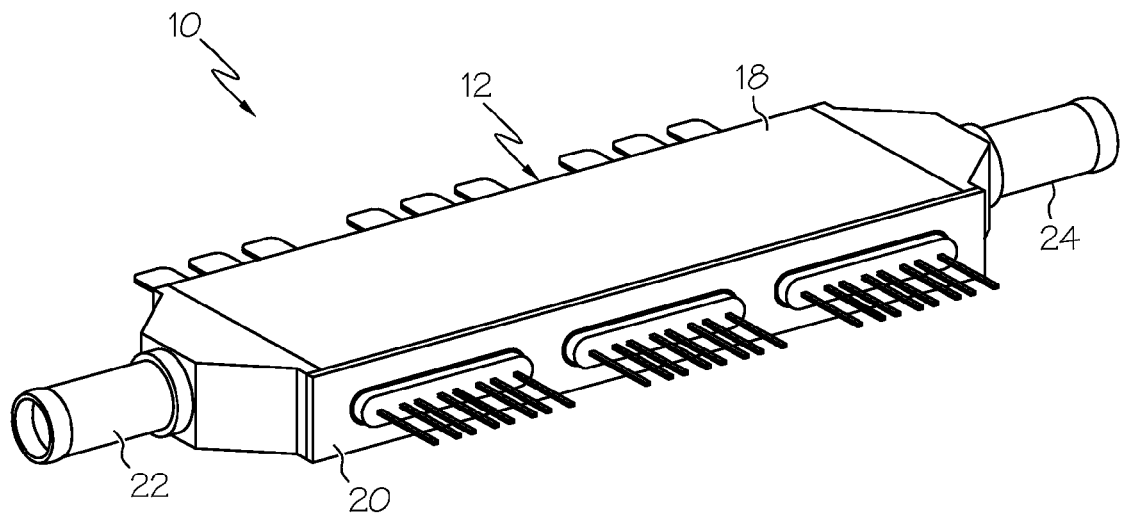
FIG. 1 is an isometric view of an immersion cooling apparatus according to this invention, including set of three multi-terminal thermally conductive modules installed in a sealed housing.
Figure 4:
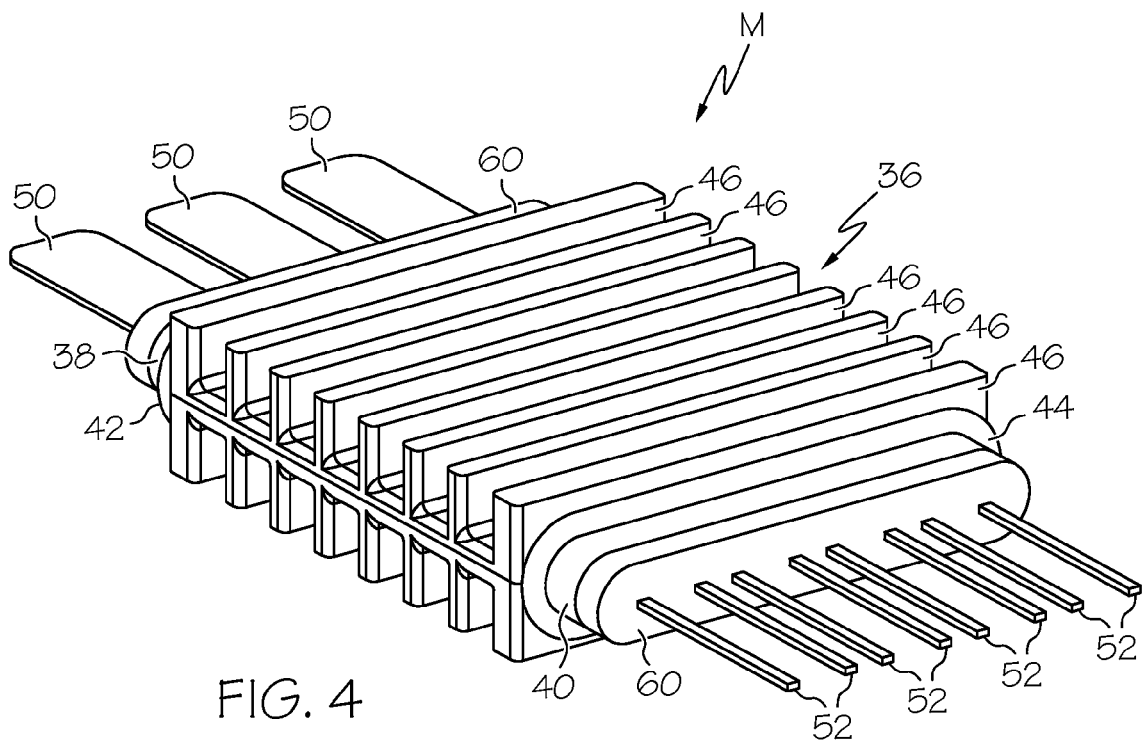
FIG. 4 is an isometric view of one of the thermally conductive modules of FIGS. 1-3.
Figure 2:
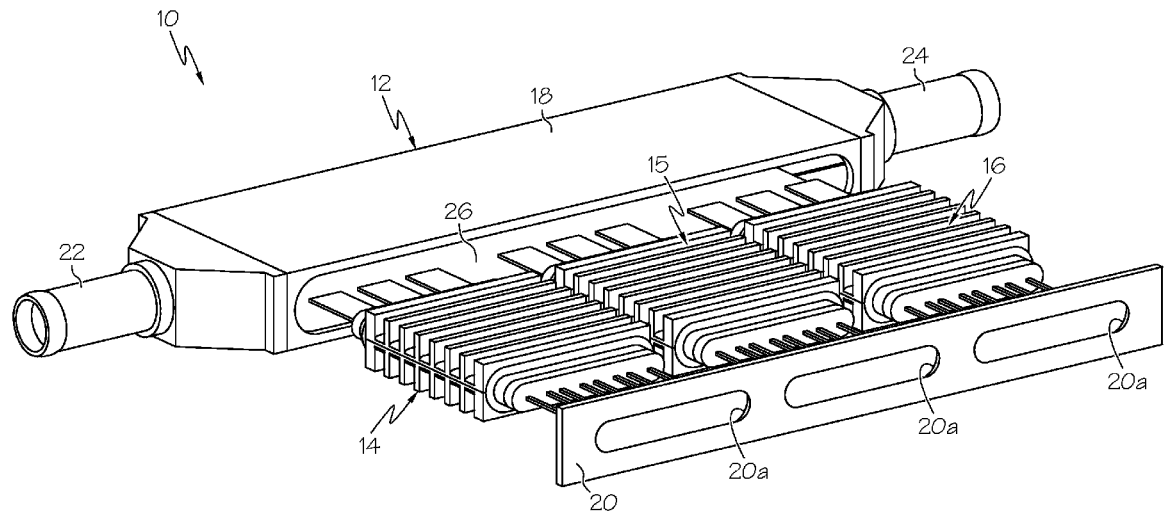
FIG. 2 is an exploded isometric view of the immersion cooling apparatus of FIG. 1.
Figure 3:
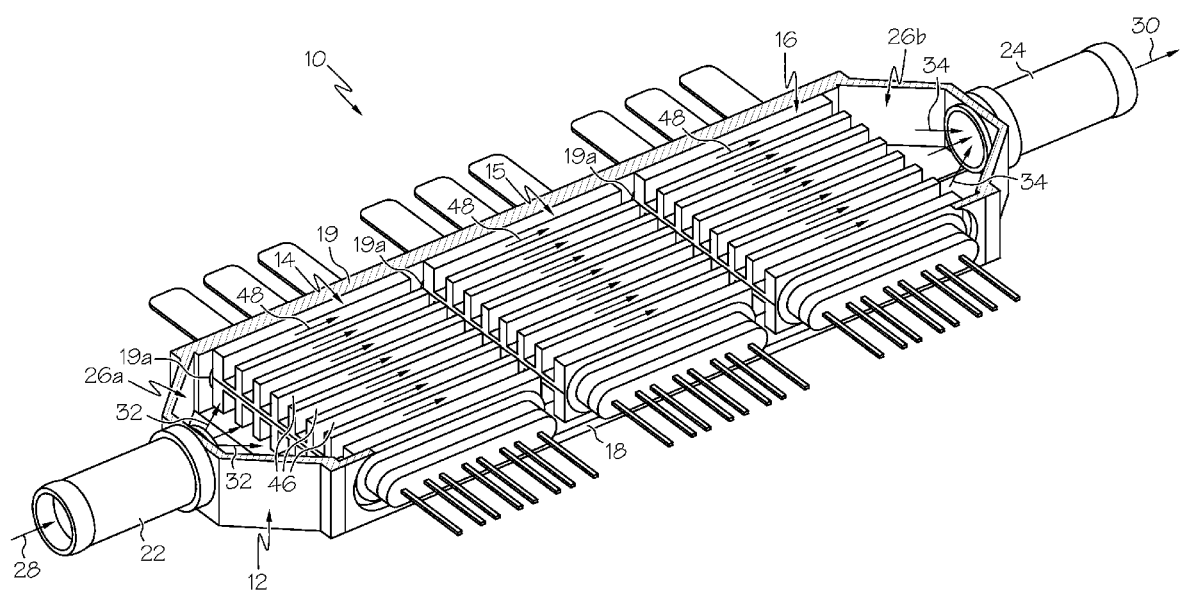
FIG. 3 is an isometric view of the immersion cooling apparatus of FIG. 1, with selected walls removed to reveal the thermally conductive modules and illustrate coolant flow through the housing.
Figure 5:
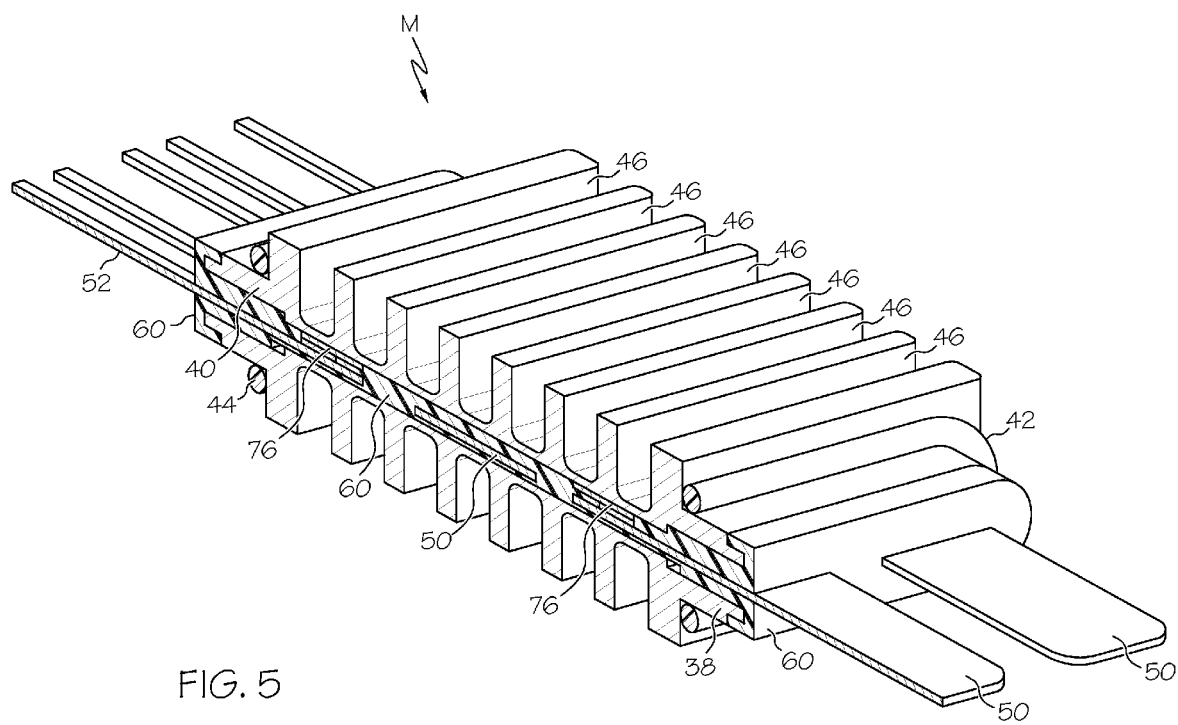
FIG. 5 is an isometric cross-sectional view of the thermally conductive module of FIG. 4.
Figure 6:
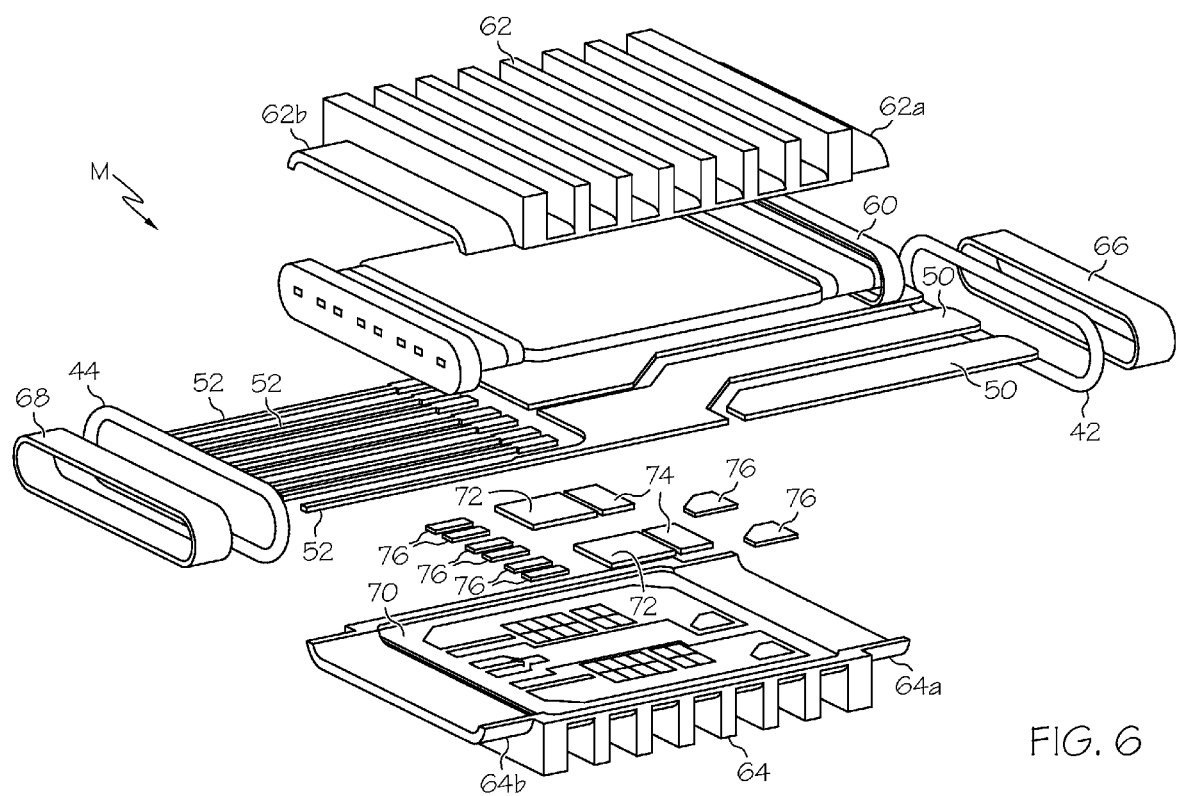
FIG. 6 is an exploded isometric view of the thermally conductive module of FIG. 4.

Referring to the drawings, FIGS. 1-3 depict an immersion cooling apparatus 10 according to the present invention. In general, the apparatus 10 includes an elongate housing 12, and at least one thermally conductive module 14 partially enclosed in the housing 12. In the embodiment of FIGS. 1-3, the apparatus 10 includes three identical thermally conductive modules 14, 15 and 16. FIGS. 4-6 depict a representative thermally conductive module M in detail.

Referring particularly to FIGS. 1-3, the housing 12 includes an elongate body portion 18 including oppositely disposed sidewalls 19 and 20, an inlet port 22, and an outlet port 24. The housing 12 has a hollow interior defining a flow-through chamber 26 joined to inlet port 22 at one end and outlet port 24 at the opposite end. A continuous flow of liquid coolant directed through inlet port 22 (as indicated by arrow 28 in FIG. 3) enters and fills the chamber 26, and excess coolant is exhausted from chamber 26 via outlet port 24 (as indicated by arrow 30 in FIG. 3). The tapered portion 26a of chamber 26 immediately downstream of inlet port 22 is open so that the in-coming coolant fans out to the entire width of the chamber 26 (as indicated by arrows 32 in FIG. 3). The tapered portion 26b of chamber 26 immediately upstream of outlet port 24 is also open and collects the out-going coolant (as indicated by arrows 34 in FIG. 3) and directs it into the outlet port 24. And as best illustrated in FIG. 3, the three thermally conductive modules 14-16 are disposed intermediate the tapered portions 26a and 26b.

Referring to the representative thermally conductive module M of FIGS. 4-5, each includes a body portion 36 and a pair of oppositely disposed connector headers 38 and 40 extending outward from opposing ends of the body portion 36. When the module M is installed in the housing 12 as illustrated in FIG. 3, its body portion 36 is disposed entirely within the chamber 26, while the connector headers 38 and 40 extend outward through openings 19a, 20a formed in the housing sidewalls 19, 20. The sidewall 20 is initially removed as shown in FIG. 2 to install the modules 14-16 in the housing 12, and then slipped over the connector headers 40 and fastened to the body portion 18 of housing 12. A leak-proof seal around the sidewall openings 19a, 20a is achieved by a pair of O-rings 42, 44 disposed about the connector headers 38 and 40 against the module's body portion 36. When the removable sidewall 20 is fastened to the body portion 18 of housing 12, the O-rings 42, 44 are compressed between the module's body portion 36 and the respective housing sidewalls 19, 20, forming the leak-proof seal.

Significantly, the modules 14-16 are supported within housing 12 by their respective connector headers 38, 40 so that their body portions 36 are effectively suspended in the housing chamber 26. As a result, the liquid coolant flowing through chamber 26 contacts all surfaces of the body portions 36. And in the illustrated embodiment, the surface area contacted by the coolant is maximized by providing a series of parallel ridges 46 in alignment with direction of coolant flow on the upper and lower faces of the body portions 36. In effect, the ridges 46 define a series of parallel channels through which the coolant can flow as illustrated by the sets of parallel arrows 48 in FIG. 3, although coolant also flows between the ridges 46 and the periphery of the chamber 26.

Referring to FIG. 6, the thermally conductive module M is illustrated as an assembly of components, including the O-rings 42 and 44, a set of power-level and signal-level lead-frame terminals 50 and 52, upper and lower body portion halves 62 and 64, a pair of retainer rings 66 and 68, and a substrate 70 supporting two bare-die IGBTs 72, two bare-die diodes 74 and several conductive spacers 76. The reference numeral 60 designates a plastic encapsulant that internally encapsulates the module components and partially overmolds the retainer rings 66 and 68, as also shown in FIG. 5. The substrate 70 is mounted on the lower half 64 of body portion 36, the leadframe terminals 50 and 52 are soldered to the bare die 72, 74 and spacers 76, and the upper half 62 of body portion 36 is joined to the lower half 64. The connector header 38 is defined by the joined ends 62*a*, 64*a* of body portion halves 62, 64, and the retainer ring 66, which is slipped over the joined ends 62*a*, 64*a*. And similarly, the connector header 40 is defined by the joined ends 62*b*, 64*b* of body portion halves 62, 64, and the retainer ring 68, which is slipped over the joined ends 62*b*, 64*b*. Of course, the internal construction of the module M is exemplary only, and it will be appreciated that the present invention is not limited thereto.

In summary, the present invention provides an improved immersion cooling apparatus whereby one or more heat-dissipative power semiconductor devices are incorporated into a thermally conductive module that is installed in a housing having a chamber through which liquid coolant is circulated such that a body portion of the thermally conductive module is suspended in the chamber and immersed in the liquid coolant flowing there-through. While the present invention has been described with respect to the illustrated embodiment, it is recognized that numerous modifications and variations in addition to those mentioned herein will occur to those skilled in the art. Accordingly, it is intended that the invention not be limited to the disclosed embodiment, but that it have the full scope permitted by the language of the following claims.

The invention claimed is:

1. Immersion cooling apparatus for at least one semiconductor device, comprising:
  a housing having an interior chamber, an inlet through which liquid coolant is supplied to said chamber, and an outlet through which liquid coolant is exhausted from said chamber; and
  a thermally conductive module incorporating the semiconductor device and installed in said housing, said thermally conductive module including a body portion and first and second connector headers extending outward from opposing ends of said body portion, where said first and second connector headers house terminals that are electrically coupled to said semiconductor device and respectively extend through first and second openings in oppositely disposed sidewalls of the housing such that said body portion is suspended in said chamber between said inlet and said outlet and immersed in said liquid coolant.

2. The immersion cooling apparatus of claim 1, further comprising:
  raised ridges on the body portion of said thermally conductive module that are parallel to a flow of coolant through said chamber.

3. The immersion cooling apparatus of claim 1, further comprising:
  a first coolant seal compressed between said first connector header and said first opening; and
  a second coolant seal compressed between said second connector header and said second opening.

4. The immersion cooling apparatus of claim 1, where:
  one of said oppositely disposed sidewalls of said housing is removable to enable insertion of said thermally conductive module into said chamber.

5. The immersion cooling apparatus of claim 1, further comprising:
  one or more additional thermally conductive modules incorporating additional semiconductor devices and installed in said housing such that body portions of said one or more additional thermally conductive modules are suspended in said chamber between said inlet and said outlet and immersed in said liquid coolant.

* * * * *